(12) United States Patent
Shanai et al.

(10) Patent No.: US 9,282,639 B2
(45) Date of Patent: Mar. 8, 2016

(54) ADHESIVE COMPOSITION, ADHESIVE VARNISH, ADHESIVE FILM AND WIRING FILM

(71) Applicant: HITACHI METALS, LTD., Tokyo (JP)

(72) Inventors: Daisuke Shanai, Hitachi (JP); Takashi Aoyama, Hitachi (JP); Kazuhiko Sasada, Saitama (JP); Hiroaki Komatsu, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 135 days.

(21) Appl. No.: 14/103,131

(22) Filed: Dec. 11, 2013

(65) Prior Publication Data

US 2014/0158413 A1 Jun. 12, 2014

(30) Foreign Application Priority Data

Dec. 12, 2012 (JP) .................................. 2012-271140
Oct. 11, 2013 (JP) .................................. 2013-213268

(51) Int. Cl.
*C09J 7/02* (2006.01)
*C09J 171/08* (2006.01)
(Continued)

(52) U.S. Cl.
CPC .............. *H05K 1/09* (2013.01); *C08G 18/6407* (2013.01); *C08G 18/8108* (2013.01); *C08G 18/8116* (2013.01); *C09J 7/0239* (2013.01); *C09J 171/00* (2013.01); *C09J 171/08* (2013.01); *C09J 175/16* (2013.01); *H05K 3/20* (2013.01); *H05K 3/386* (2013.01); *C08L 79/085* (2013.01); *C09J 2201/128* (2013.01); *C09J 2203/326* (2013.01); *C09J 2461/00* (2013.01);
(Continued)

(58) Field of Classification Search
CPC ........... C08G 18/8407; C08G 18/8116; C08G 18/8108; C09J 7/0239; C09J 171/08; C09J 2201/128; C09J 2203/326; C09J 2461/00; H05K 3/20; H05K 3/386; H05K 2201/0154; H05K 1/09; Y10T 428/2896; Y10T 428/24975
USPC ....... 428/355 N, 435, 216; 174/259; 524/451, 524/540
See application file for complete search history.

(56) References Cited

U.S. PATENT DOCUMENTS

| 5,523,137 A | 6/1996 | Sei et al. |
| 5,843,550 A | 12/1998 | Sei et al. |

(Continued)

FOREIGN PATENT DOCUMENTS

| JP | 5-29399 A | 2/1993 |
| JP | 2001-262111 | 9/2001 |

(Continued)

*Primary Examiner* — Thao T Tran
(74) *Attorney, Agent, or Firm* — Foley & Lardner LLP

(57) ABSTRACT

An adhesive composition includes (A) a phenoxy resin including a plurality of hydroxyl groups at a side chain: 100 parts by mass, (B) a multifunctional isocyanate compound including an isocyanate and at least one functional group selected from the group consisting of a vinyl group, an acrylate group and a methacrylate group within its molecule: 2 to 55 parts by mass, (C) a maleimide compound and/or a reaction product thereof having a plurality of maleimide groups within its molecule: 5 to 30 parts by mass, and (D) one or more kinds of an inorganic filler having an average particle size of 5 μm or less which is measured by a laser diffraction: 1 to 50 parts by mass, a total amount of the components (B) and (C) is 7 to 60 parts by mass.

8 Claims, 2 Drawing Sheets

(51) Int. Cl.
*H05K 1/02* (2006.01)
*H05K 1/09* (2006.01)
*H05K 3/38* (2006.01)
*H05K 3/20* (2006.01)
*C08G 18/64* (2006.01)
*C08G 18/81* (2006.01)
*C09J 171/00* (2006.01)
*C09J 175/16* (2006.01)
*C08L 79/08* (2006.01)

(52) U.S. Cl.
CPC .......... *C09J 2479/086* (2013.01); *H05K 3/389* (2013.01); *H05K 2201/0154* (2013.01); *Y10T 428/24975* (2015.01); *Y10T 428/2896* (2015.01)

(56) References Cited

U.S. PATENT DOCUMENTS

| | | |
|---|---|---|
| 5,945,188 A | 8/1999 | Sei et al. |
| 6,235,842 B1 * | 5/2001 | Kuwano et al. ............... 525/119 |
| 2011/0139496 A1 * | 6/2011 | Nakamura ................... 174/256 |
| 2012/0138345 A1 * | 6/2012 | Amou et al. .................. 174/255 |

FOREIGN PATENT DOCUMENTS

| | | |
|---|---|---|
| JP | 2004-136631 A | 5/2004 |
| JP | 2008-258607 A | 10/2008 |
| JP | 2010-143988 A | 7/2010 |
| JP | 2010-150437 A | 7/2010 |

* cited by examiner

ADHESIVE COMPOSITION, ADHESIVE VARNISH, ADHESIVE FILM AND WIRING FILM

The present application is based on Japanese patent application No. 2012-271140 filed on Dec. 12, 2012 and Japanese patent application No. 2013-213268 filed on Oct. 11, 2013, the entire content of which are incorporated herein by reference.

BACKGROUND OF THE INVENTION

1. Field of the Invention

The present invention relates to an adhesive composition, an adhesive varnish, an adhesive film and a wiring film; more specifically to an adhesive composition, an adhesive varnish, an adhesive film and a wiring film which excel in adhesion property, preservation stability and handleability.

2. Related Art

Since electric and electronic devices have become more space-saving and lighter in recent years, an internal wiring material is required to enable a high density wiring through a micro wiring and a thinner body. Further, more and more devices are using lead-free solder instead of conventional lead solder. As a result, the internal wiring material is required to be more heat-resistant.

An insulating layer of the above wiring material basically comprises a base material film and an adhesive layer (see e.g. JP-A H05-29399). As the base material film, e.g., an organic insulating film comprising a heat-resistant film such as polyimide, polyetherimide, polyphenylene sulfide, polyether ether ketone, and a composite heat-resistant film such as an epoxy resin glass cloth, an epoxy resin polyimide glass cloth is disclosed. As an adhesive layer, an adhesive including a polyamide resin and an epoxy resin is disclosed.

However, the adhesive disclosed in JP-A H05-29399 has a disadvantage that the preservation stability is low due to high reactivity between an amino group existing in the structure of polyamide resin and an epoxy resin. An adhesive comprising a phenoxy resin having an epoxy group at ends, acrylic rubber and a curing agent is proposed to solve the above disadvantage (see e.g. JP-A 2004-136631). As the phenoxy resin, e.g. bisphenol A type, bisphenol F type, bisphenol AD type, bisphenol S type or copolymerization type of bisphenol A and bisphenol F are disclosed. Although the adhesive disclosed in JP-A 2004-136631 is produced by compounding a phenoxy resin, which is to have a relatively high adhesion property, there is a disadvantage in that adhesion force is as weak as 0.5 kN/m and that the soldering heat resistance is slightly low level of 260° C.

As a method for solving the above problems, an adhesive including a thermoplastic polyurethane resin with a mass average molecular weight of 80,000 to 800,000, an epoxy resin, an epoxy resin curing agent is disclosed (see e.g. JP-A 2010-150437).

Although a normal polyurethane resin has a disadvantage in preservation stability because of its high reactivity with an epoxy resin, JP-A 2010-150437 discloses that using a polyurethane resin having a specific molecular weight range improves the preservation stability. Adhesion force thereof is 1.1 to 1.7 kN/m.

Further, it is disclosed that the soldering heat resistance of an adhesive including a polyurethane resin, an epoxy resin and a novolac resin with a specific structure is 300° C. (see e.g. JP-A 2010-143988). However, the polyurethane resins used in JP-A 2010-150437 and JP-A 2010-143988 have been generally known to decopolymerize at a temperature of 200° C. or higher. Since the heat resistance of polyurethane is generally to be 80 to 100° C., there are some concerns about applying the adhesive including a polyurethane resin to the field of industrial and automobile electronic devices, which demands high heat resistance.

Further, an adhesive including a (meth)acrylic-modified phenoxy resin and an epoxy resin, and similarly an adhesive including a (meth)acrylic-modified phenoxy resin, an urethane acrylate oligomer and a silane coupling agent are respectively disclosed (see e.g. JP-A 2001-262111 and JP-A 2008-258607). The adhesive including an epoxy resin disclosed in JP-A 2001-262111 has a disadvantage that adhesion force is as low as 0.6 kN/m despite superior heat resistance. Further, as for the adhesive including an urethane acrylate and a silane coupling agent disclosed in JP-A 2008-258607, adhesion force with a polyimide film, which has a high heat resistance despite its superior adhesion force with a metallic conductor, is not thoroughly taken into consideration.

Moreover, it is important in handling the adhesive film that a curl is as small as possible, and that there is no tuck on an adhesive layer.

SUMMARY OF INVENTION

The object of the present invention, which is made in view of the above disadvantages, is to provide an adhesive composition, an adhesive varnish, an adhesive film and a wiring film, which excel in adhesion property, preservation stability and handleability.

To achieve the above object, the present invention provides an adhesive composition, an adhesive varnish, an adhesive film and a wiring film as follows.

(1) According to a first feature of the invention, an adhesive composition includes:

(A) a phenoxy resin including a plurality of hydroxyl groups at a side chain: 100 parts by mass;

(B) a multifunctional isocyanate compound comprising an isocyanate and at least one functional group selected from the group consisting of a vinyl group, an acrylate group and a methacrylate group within its molecule: 2 to 55 parts by mass;

(C) a maleimide compound and/or a reaction product thereof having a plurality of maleimide groups within its molecule: 5 to 30 parts by mass; and (D) one or more kinds of an inorganic filler having an average particle size of 5 μm or less which is measured by a laser diffraction: 1 to 50 parts by mass, wherein a total amount of the components (B) and (C) is 7 to 60 parts by mass.

(2) The adhesive composition according to (1) may further include:

(E) an urethane-forming catalyst: 0.001 to 0.1 parts by mass; and (F) a radical polymerization inhibitor: 0.0002 to 1 parts by mass.

(3) In the adhesive composition according to (1) or (2), the inorganic filler in the component (D) may be an oxide, a hydroxide, a carbonate or a silicate which includes at least one element selected from the group consisting of magnesium, aluminum, silicon and calcium.

(4) In the adhesive composition according to any one of (1) to (3), the phenoxy resin in the component (A) may comprise a mass average molecular weight in terms of styrene of 40,000 to 100,000.

(5) According to a second feature of the invention, an adhesive varnish includes the adhesive composition according to any one of (1) to (4) and methyl ethyl ketone.

(6) According to a third feature of the invention, an adhesive film comprises:
a polyimide base material; and
an adhesive layer comprising the adhesive composition according to any one of (1) to (4) and provided on either or both surfaces of the polyimide base material.

(7) In the adhesive film according to (6), the adhesive layer may comprise a thickness of 10 to 100 µm and the polyimide base material comprises a thickness of 25 to 100 µm.

(8) According to a fourth feature of the invention, a wiring film comprises:
a first adhesive film comprising a polyimide base material and an adhesive layer comprising the adhesive composition according to claim 1 on a surface of the polyimide base material;
a second adhesive film comprising a polyimide base material and an adhesive layer comprising the adhesive composition according to claim 1 on a surface of the polyimide base material, the second adhesive film being located such that the adhesive layers of the first and second adhesive films face each other; and
a conductor wiring sandwiched between the adhesive layers of the first and second adhesive films,
wherein the adhesive layers are bonded by a thermal fusion bonding.

(9) According to a fifth feature of the invention, a wiring film comprises:
a double-sided adhesive film comprising a polyimide base material and adhesive layers comprising the adhesive composition according to claim 1 on both surfaces;
single-sided adhesive films, each of which comprises a polyimide base material and an adhesive layer comprising the adhesive composition according to claim 1 on a surface of the polyimide base material, the single-sided adhesive films being located such that the adhesive layers of the single-sided adhesive films face to the adhesive layers of the double-sided adhesive film, respectively;
conductor wirings sandwiched between the adhesive layers of the double-sided adhesive film and the adhesive layers of the single-sided adhesive films, respectively,
wherein the adhesive layers are bonded by a thermal fusion bonding.

(10) In the wiring film according to (8), the conductor wiring may comprise a thickness of 35 to 500 µm. In the wiring film according to (9), each of the conductor wirings may comprise a thickness of 35 to 500 µm.

(11) In the wiring film according to (8), the wiring film may be post-heated at a temperature higher a fusion bonding temperature of the adhesive layer. In the wiring film according to (9), the wiring film may be post-heated at a temperature higher a fusion bonding temperature of the adhesive layer.

(12) In the wiring film according to (8), the conductor wiring may comprise a copper wiring. In the wiring film according to (9), each of the conductor wirings may comprise a copper wiring.

(13) In the wiring film according to (8), at least a part of an external layer of the copper wiring may be covered by at least one layer selected from the group consisting of a metal layer, a metal oxide layer and a metal hydroxide layer, which includes at least one element selected from the group consisting of tin, nickel, zinc and cobalt. In the wiring film according to (9), at least a part of an external layer of each of the copper wirings may be covered by at least one layer selected from the group consisting of a metal layer, a metal oxide layer and a metal hydroxide layer, which includes at least one element selected from the group consisting of tin, nickel, zinc and cobalt.

(14) In the wiring film according to (8), at least a part of an external layer of the conductor wiring may be covered by a silane coupling agent including at least one functional group selected from the group consisting of an amino group, a vinyl group, a styryl group, an acrylate group and a methacrylate group. In the wiring film according to (9), at least a part of an external layer of the conductor wiring may be covered by a silane coupling agent including at least one functional group selected from the group consisting of an amino group, a vinyl group, a styryl group, an acrylate group and a methacrylate group.

(Effects of Invention)

The present invention provides an adhesive composition, an adhesive varnish, an adhesive film and a wiring film; more specifically to an adhesive composition, an adhesive varnish, an adhesive film and a wiring film which excel in adhesion property, preservation stability and handleability.

BRIEF DESCRIPTION OF THE DRAWINGS

The embodiment of the present invention will be described in conjunction with appended drawings, wherein.

DETAILED DESCRIPTION OF THE EMBODIMENTS

Figure 1:
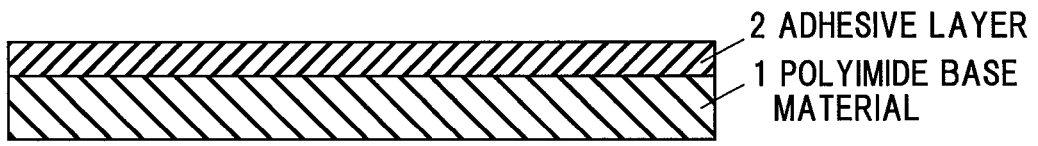
FIG. 1 is a cross-sectional view showing an adhesive film according to a first embodiment of the present invention.

Next, embodiments of the present invention will be described in more detail.

(Summary of the Embodiment)

An adhesive composition according to the embodiment of the present invention comprises following components (A), (B), (C) and (D) in a blending amount as follows, and wherein the total amount of the components (B) and (C) is 7 to 60 parts by mass:

(A) a phenoxy resin comprising plurality of hydroxyl groups at a side chain: 100 parts by mass, (B) a multifunctional isocyanate compound having an isocyanate and at least one functional group selected from the group consisting of a vinyl group, an acrylate group and a methacrylate group within the molecule: 2 to 55 parts by mass, (C) a maleimide compound and/or a reaction product thereof having a plurality of maleimide groups within the molecule: 5 to 30 parts by mass, and (D) one or more kinds of an inorganic filler wherein the average particle size thereof measured by a laser diffraction is 5 µm or less: 1 to 50 parts by mass.

Further, an adhesive varnish according to the embodiment of the present invention includes the above adhesive composition and methyl ethyl ketone.

Further, an adhesive film according to the embodiment of the present invention comprises an adhesive layer comprising the adhesive composition on either or both surfaces of a polyimide base material.

Moreover, a wiring film according to the embodiment of the present invention is fabricated by placing the adhesive films to have its adhesive layers facing each other, by arranging a conductor wiring to be sandwiched therebetween, and then by bonding the adhesive layers by a thermal fusion bonding.

(Embodiments)

1. An Adhesive Composition

An adhesive composition includes following components (A), (B), (C) and (D) in a blending amount as follows, and wherein the total amount of the components (B) and (C) is 7 to 60 parts by mass:

(A) a phenoxy resin comprising plurality of hydroxyl groups at a side chain: 100 parts by mass, (B) a multifunctional isocyanate compound having an isocyanate and at least one functional group selected from the group consisting of a vinyl group, an acrylate group and a methacrylate group within the molecule: 2 to 55 parts by mass, (C) a maleimide compound and/or a reaction product thereof having a plurality of maleimide groups within the molecule: 5 to 30 parts by mass, and (D) one or more kinds of an inorganic filler wherein the average particle size thereof measured by a laser diffraction is 5 µm or less: 1 to 50 parts by mass.

(1) Component (A): The Phenoxy Resin

The component (a) used in the adhesive composition according to the embodiment of the present invention is the phenoxy resin comprises plurality of hydroxyl groups at a side chain. Since the component (A) is used as a base resin, a phenoxy resin which excels in high preservation stability, heat-resistance after being bonded and moisture-proof reliability, and in which 5% thermal mass reduction temperature exceeds 350° C. is used.

The phenoxy resin forming the component (A) imparts a film forming property to the adhesive composition, and after being cured, when used for an adhesive film, for example, gives flexibility and mechanical strength to its adhesive layer.

A molecular weight range for developing the above functions is normally a mass average molecular weight in terms of polystyrene (hereinafter, may be referred to as "mass molecular average weight in terms of styrene") which is measured by the gel permeation chromatography (GPC) method in a range of 20,000 to 100,000. In view of maintaining and improving adhesion force of a cured product, and mechanical strength of an adhesive layer of an adhesive film, the mass average molecular weight in terms of styrene is preferably 40,000 to 100,000.

The bisphenol A type phenoxy resin may comprise e.g. YP-55U, YP-50, YP-50S, YP-50 and EK35 B (trade name) manufactured by Nippon Steel & Sumikin Chemical Co., Ltd. may be used.

(2) Component (B): The Multifunctional Isocyanate Compound

The component (B) according to the embodiment of the present invention comprises a multifunctional isocyanate compound having an isocyanate and at least one functional group selected from the group consisting of a vinyl group, an acrylate group and a methacrylate group.

When used for a wiring film and the like, for example, the component (B) enhances solubility of the phenoxy resin in an versatile solvent by reacting with the hydroxyl groups at a side chain of the phenoxy resin, includes an isocyanate group in its molecule to impart a radical polymerization property, namely, a crosslinking property to the phenoxy resin and uses the multifunctional isocyanate compound including the vinyl group the acrylate group and the methacrylate group which have a different reactivity than that of the isocyanate group to improve the heat resistance and the like of the adhesive composition. That is, the multifunctional isocyanate compound comprising the component (B) enhances solubility of phenoxy resin in the versatile solvent, gives the radical polymerization property (the crosslinking property) to the phenoxy resin and has a function of improving the heat resistance and the like of the adhesive composition. The multifunctional isocyanate compound can have an alkoxy silyl group.

The multifunctional isocyanate compound comprising the component (B) may comprise e.g. vinyl isocyanate, butyl isocyanate, hexyl isocyanate, octadecyl isocyanate, cyclohexyl isocyanate, phenyl isocyanate, methacryl isocyanate, 4-methylbenzyl isocyanate, 2-methacryloyloxyethyl isocyanate, 1,1-bis (acryloyloxymethyl)ethyl isocyanate, 3-isocyanate propyl trimethoxysilane.

More specifically, vinyl isocyanate (manufactured by Sigma Aldrich Japan K.K.), 2-methacryloyloxyethyl isocyanate (manufactured by Showa Denko K.K. under trade name of Karenz (Registered Trademark) MOI), 2-acryloyloxyethyl isocyanate (manufactured by Showa Denko K.K. under trade name of Karenz (Registered Trademark) AOI) 1,1-bis (acryloyloxymethyl)ethyl isocyanate (manufactured by Showa Denko K.K. under trade name of Karenz (Registered Trademark) BEI) and the like may be used.

The blending amount of the multifunctional isocyanate compound constituting the component (B) is 2 to 55 parts by mass with respect to 100 parts by mass of the phenoxy resin comprising the component (A). When the multifunctional isocyanate compound is less than 2 parts by mass, solubility of the phenoxy resin lowers and a varnish becomes heterogeneous. When the value is more than 55 parts by mass, adhesion force of an adhesive lowers.

In the adhesive composition according to the embodiment of the present invention, the total amount of the multifunctional isocyanate constituting the component (B) and the maleimide compound comprising the component (C), to be described below, is required to be in the range of 7 to 60 parts by mass. When the value is less than 7 parts by mass, desired effect cannot be obtained. When the value is more than 60 parts by mass, flexibility disappears due to excessive crosslinking.

(3) Component (C): The Maleimide Compound and/or Reaction Product Thereof

The component (C) used for the adhesive composition according to the embodiment of the present invention comprises the maleimide compound and/or the reaction product having plurality of maleimide groups in the molecule.

As for the component (C), when used for the adhesive film, the wiring film and the like, for example, the maleimide compound and/or the reaction product having plurality of maleimide groups in the molecule is used as a crosslinking agent showing excellent adhesion property, to improve adhesion property between the adhesive composition and a polyimide film, for example, as a base material film. More specifically, the maleimide compound having plurality of maleimide group in the molecule is a component which reacts with the hydroxyl groups in the phenoxy resin and unsaturated double bond-including groups introduced by the phenoxy resin and gives curing property and adhesion force to a system, and which thereby has a function of improving heat resistance, moisture-proof reliability, adhesion property and chemical resistance of the adhesive layer after being cured.

As the maleimide compound comprising the component (C), e.g., BMI-1000, BMI-2000, BMI-5000, BMI-5100, and BMI-TMH (trade name) manufactured by Daiwakasei Industry Co., Ltd. and the like may be used.

The blending amount of the maleimide compound constituting the component (C) is 5 to 30 parts by mass with respect to 100 parts by mass of the phenoxy resin comprising the component (A). When the value is less than 5 parts by mass, heat resistance tends to lower; when the value is more than 30 parts by mass, adhesion force tends to lower.

(4) Component (D): The Inorganic Filler

The component (D) used for the adhesive composition according to the embodiment of the present invention comprises one or more kind of inorganic fillers having an average particle size of 5 μm or less. The average particle size herein is a median size (d50) in a particle distribution of particle size measured by a laser diffraction.

The component (D) is used for improving poor handleability (hereinafter, may be referred to as "handling ability") of the adhesive film and the like. In other words, since the surface of the adhesive layer formed on the base material without using the inorganic filler comprising the component (D) is flat, overlapping the above adhesive layers with each other leads to poor slipperiness because of a tuck on the adhesive layer. By adding the inorganic filler, the surface of the adhesive films are made a little rough and the filler comes to exit on the surface. As a result, even though the surfaces of the adhesive layers are overlapped with each other, a probability that adhesive resin components are directly in contact decreases and slipperiness improves. To sum up, the inorganic filler constituting the component (D) has a function of improving handling ability.

As for the component (D), one or more kind of inorganic filler having an average particle size of 5 μm or less is used for improving handling ability and the like. When the average particle size exceeds 5 μm, adhesion force lowers considerably by adding even only a small amount. Further, when used for the adhesive varnish, a precipitation occurs immediately and the resulting varnish lacks stability.

The component (D) is preferably an oxide, a hydroxide, a carbonate or a silicate which comprises at least one element selected from the group consisting of magnesium, aluminum, silicon and calcium, because of an appropriate balance and an ease of use.

More specifically, a component including magnesium may comprise magnesium oxide, magnesium hydroxide, magnesium carbonate, magnesium silicate such as talc; a component including aluminum may comprise aluminum oxide, aluminum hydroxide, aluminum silicate such as hydrotalcite and kaolinite; a component including silicon may comprise silica and silica magnesia; and a component including calcium may comprise calcium carbonate, dolomite, huntite, colemanite, aluminum calcium silicate.

The magnesium hydroxide may comprise e.g. products manufactured by Konoshima Chemical Co., Ltd. under trade names of Magseeds N-4, Magseeds N-6, Magseeds S-4, Magseeds S-6, Magseeds V-6F, Magseeds EP and Magseeds W; products manufactured by Kyowa Chemical Industry Co., Ltd. under trade names of KISMA 5A and KISMA 5L; and products manufactured by Sakai Chemical Industry Co., Ltd. under trade names of MGZ-1, MGZ-3, MGZ-5R, MGZ-6R and the like.

The magnesium oxide may comprise e.g. products manufactured by Konoshima Chemical Co., Ltd. under trade names of Starmag PSF, Starmag PSF-150, Starmag M, Starmag L, Starmag P and the like.

The magnesium carbonate may comprise e.g. products manufactured by Konoshima Chemical Co., Ltd. under a trade name of Magnesite MSS and the like.

The talc may comprise e.g. products manufactured by Nippon Talc Co., Ltd. under trade names of NANO ACE D-1000, NANO ACE D-800, NANO ACE D-600, MICRO ACE SG-2000, MICRO ACE SG-1000, MICRO ACE SG-200, MICRO ACE SG-95, MICRO ACE P-8, MICRO ACE P-6; products manufactured by Takehara Kagaku Kogyo Co., Ltd. under trade names of High Tron, High Tron A, Microlight, Hi Micron HE5; and products manufactured by Nihon Mistron Co., Ltd. under a trade name of Mistron Paper Series and the like.

The aluminum hydroxide may comprise e.g. products manufactured by Nippon Light Metal Company, Ltd. under trade names of BF013, B703, B1403; and products manufactured by Showa Denko K.K. under trade names of HIGILIGHT H-42, HIGILIGHT H-42M, HIGILIGHT H-43, HIGILIGHT H-43M and the like.

The hydrotalcite may comprise e.g. products manufactured by Kyowa Kagaku Industry Co, Ltd. under trade names of DHT4A, Alcamizer and the like.

The kaolinite may comprise e.g. products manufactured by Shiraishi Calcium Kaisha, Ltd. under trade names of ST-301, ST-309, ST-100, ST-KE, Iceberg K; products manufactured by Takehara Kagaku Kogyo Co., Ltd. under trade names of RC-1, Glomax LL, Satintone W, Satintone No. 5; and products manufactured by Hayashi Kasei Co., Ltd. under trade names of Translink #37, Translink #77, and Translink #445 and the like.

The silica may comprise e.g. products manufactured by Tosoh Silica Corporation under trade names of Nipsil VN-3, Nipsil E-200A, NIPGEL AZ-200, AY-201; products manufactured by Nippon Aerosil Co., Ltd. under trade names of AEROSIL 200, AEROSIL R-972 and the like.

The silica magnesia may comprise e.g. products manufactured by Mizusawa Industrial Chemicals, Ltd. under trade names of Mizupearl M-302, Mizupearl M-202, Mizupearl M-204 and the like.

The calcium carbonate may comprise e.g. products manufactured by Bihoku Funka Kogyo Co., Ltd. under trade names of SOFTON 1200, SOFTON 1800, SOFTON 2200, SOFTON 3200, LIGHTON BS-0, products manufactured by Sankyo Seifun Co., Ltd. under trade names of SCP-E #2010, SCP-E #2300, Escalon #1500, products manufactured by Shiraishi Calcium Kaisha, Ltd. under trade names of Vigot 10, Vigot 15 and the like.

The huntite may comprise e.g. products manufactured by LKAB Minerals (Former Mineclo) under trade names of UltraCarb Series and the like.

The colemanite may comprise e.g. products manufactured by Kinsei Matec Co., Ltd. under trade names of UBP and the like.

The aluminum calcium silicate may comprise e.g. products manufactured by Eishin Chemicals Co., Ltd. (former Katsuta Kako) under trade names of CS-100 and the like.

The blending amount of the inorganic filler constituting the component (D) is 1 to 50 parts by mass with respect to 100 parts by mass of the phenoxy resin comprising the component (A). When the value is less than 1 mass, slipperiness improves less effectively; when the value is more than 50 parts by mass, initial adhesion force lowers considerably.

(5) Component (E): Urethane-Forming Catalyst

The component (E) used in the adhesive composition as needed according to the embodiment of the present invention comprises the urethane-forming catalyst. The urethane bond constituting the component (E) has a function of accelerating a formation of an urethane bond between the multifunctional isocyanate compound comprising the component (B) and the phenoxy resin comprising the component (A).

The urethane-forming catalyst constituting the component (E) may comprise e.g. metallic salt such as dibutyltin dilaurate and a tertiary amine such as triethyl amine, N,N-dimethylcyclohexylamine.

The blending amount of the urethane-forming catalyst constituting the component (E) is preferably 0.001 to 0.1 parts by mass with respect to 100 parts by mass of the phenoxy resin comprising the component (A). When the amount is small, there is little effect; when the amount is too large, a bleed-out occurs, which may cause a decline in adhesion force.

(6) Component (F): Radical Polymerization Inhibitor

The component (F) used in the adhesive composition as needed according to the embodiment of the present invention comprises the radical polymerization inhibitor. The radical polymerization inhibitor constituting the component (F) has a function of restraining an unnecessary radical polymerization in adjustment of the adhesive agent, during storage of the adhesive varnish and during storage of the adhesive film, and eventually, has a function as an antioxidant of the adhesive layer and a function of contributing to improving heat resistance of the wiring films.

The radical polymerization inhibitor constituting the component (F) may comprise e.g. phenols such as t-butylhydroquinone, 2,6-t-butyl-4-methylphenol, 2,6-di-t-butyl-4-methylphenol, t-butyl pyrocatechol.

The blending amount of the inorganic filler comprising the component (D) is preferably 0.0002 to 1 parts by mass with respect to 100 parts by mass of the phenoxy resin comprising the component (A). When the amount is small, there is little effect; when the amount is too large, a bleed-out occurs, which may cause a decline in adhesion force.

(7) Other Component: Radical Polymerization Initiator, Silane Coupling Agent and the Like.

The adhesive composition according to the embodiment of the present invention can contain a radical polymerization initiator as needed. The radical polymerization initiator has a function of accelerating crosslinking reaction between the maleimide compound constituting the component (C) and a product of a reaction between the multifunctional isocyanate compound constituting the component (B) and the phenoxy resin constituting the component (A).

The radical polymerization agent is preferably various organic peroxide having a one hour half-life temperature of 80 to 120° C.; more specifically, products manufactured by NOF Corporation under trade names of PERHEXA C, PERHEXA V, PERHEXA25B and the like.

The blending amount thereof is preferably 0.03 to 1 parts by mass. When the amount is small, there is little effect; when the amount is too large, a crosslinking reaction progresses excessively, which may cause a decline in adhesion force on the contrary.

Further, the adhesive composition according to the embodiment of the present invention may include the silane coupling agent and the like, as needed. For example, an isocyanate silane compound enhances solubility of the phenoxy resin in a versatile solvent by reacting with the hydroxyl groups at a side chain of the phenoxy resin, introduces a silanol group and/or an alkoxysilane group at a side chain of the phenoxy resin, has a function of contributing to improving heat resistance and improving solubility through crosslinking between alkoxysilane groups and/or silanol groups. The compound may comprise e.g. 3-(triethoxysilyl)propyl isocyanate.

Further, a silane compound having at least one functional group selected from the group consisting of an amino group, a vinyl group, a styryl group, an acrylate group and a methacrylate group has a function of contributing to improving strength of the adhesive composition and contributing to heat resistance through a chemical bond with a hydroxyl group on the surface of the inorganic filler. For the above compound, e.g., 3-aminopropyl trimethoxysilane, 3-aminopropyl triethoxysilane, N-2-(aminoethyl)-3-aminopropyl triethoxysilane, N-2-(aminoethyl)-3-aminopropyl trimethoxysilane, vinyl trimethoxysilane, vinyl triethoxysilane, 3-methacryloxypropylmethyldimethoxysilane, 3-methacryloxypropyl trimethoxysilane, 3-acryloxypropyl trimethoxysilane may be used. Plurality of the above silane coupling agents can be blended before being used.

The blending amount of the silane coupling agent is preferably 0.01-10 parts by mass. When the amount is small, a crosslinking reaction progresses excessively, which may cause a decline in adhesion force on the contrary. Strength of the adhesive composition improves by blending the silane coupling agent, due to a chemical bond with a hydroxyl group on the surface of the inorganic filler.

The adhesive composition according to the embodiment of the present invention is excellent in adhesion property, preservation stability and handleability. The adhesive film fabricated by using this is excellent in handleability due to restraint of a tuck and a curl, and has a superior heat resistance.

2. Adhesive Varnish

The adhesive varnish according to the embodiment of the present invention comprises the above adhesive composition and methyl ethyl ketone. That is, in the adhesive varnish according to the present invention, methyl ethyl ketone which is an versatile solvent having a boiling point of 100° C. or less as a solvent is used to make the above adhesive composition into a varnish.

By adjusting the adhesive varnish according to the embodiment of the present invention so as to include the above adhesive composition and methyl ethyl ketone, solubility of the phenoxy resin comprising the component (A) in an versatile solvent increases and the adhesive varnish which can be dehydrated at a low temperature. The adhesive film fabricated from the adhesive varnish according to the embodiment of the present invention forms less curls and less tucks, and excels in handling ability. Further, the wiring film, which the final product fabricated by using the above adhesive film combines heat resistance, moisture-proof reliability, superior adhesion property.

3. Adhesive Film

As shown in FIG. 1, the adhesive film according to the first embodiment of the present invention comprises the adhesive layer 2 comprising the above adhesive composition (produced from the adhesive varnish) on one surface of a polyimide base material 1. This adhesive film may be referred to as a single-sided adhesive film.

Figure 2:
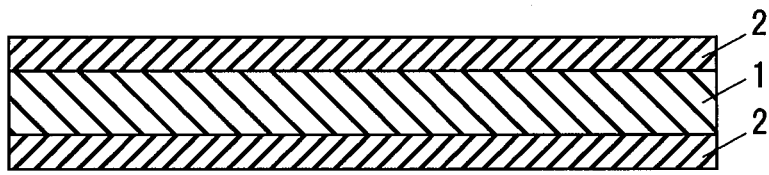
FIG. 2 is a cross-sectional view showing an adhesive film according to a second embodiment of the present invention.

Further, as shown in FIG. 2, the adhesive film according to the second embodiment of the present invention comprises the adhesive layer 2 comprising the above adhesive composition (fabricated from the adhesive varnish) on both surfaces of the polyimide base material 1. The adhesive film may be called a double-sided adhesive film.

For the adhesive film according to the embodiment of the present invention, the polyimide base material which excels in heat resistance is used as a base material.

It is preferable to use a polyimide film having a breaking elongation rate of 75% or more at 25° C. for the polyimide base material. The adhesion reliability of the wiring film which is the final product can be increased by using a polyimide film with excellent flexibility for the polyimide base material 1, because adhesion force between the adhesive composition and the polyimide base material can be increased, and also breaking of the adhesive film can be restrained without conduction surface modification on the polyimide base material. The above polyimide film may comprise e.g. products manufactured by Du Pont-Toray Co., Ltd. under trade names of Kapton (Registered Trademark) 100V, 200V, 100H and 200H; products manufactured by Kaneka Corporation under a trade name of Apical (Registered Trademark) 25NPI and the like.

A thickness of the polyimide base material 1 can be suitably selected depending on an objective. The thickness of the polyimide base material 1 is preferably selected from a range of 25 to 100 µm in view of productivity and handling ability of the adhesive film and the wiring film.

The adhesive layer comprises the above adhesive composition. The thickness of the adhesive layer 2 is preferably selected from a range of 10 to 100 µm in view of productivity and handling ability of the adhesive film and the wiring film. More specifically, when the wiring film is fabricated, a wiring can show a satisfactory embedding property by suitably selecting the thickness from the above range in accordance with the thickness of a conductor wiring 3.

4. Wiring Film

Figure 3:
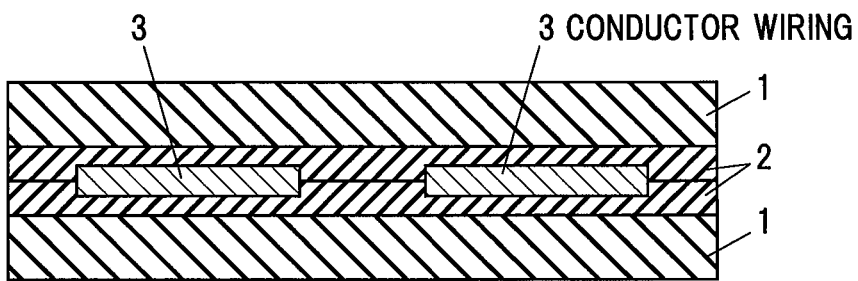
FIG. 3 is a cross-sectional view showing a wiring film according to the first embodiment of the present invention.

As shown in FIG. 3, the wiring film according to the first embodiment of the invention is fabricated by placing the adhesive layers 2 of the above adhesive films facing with each other, by arranging the conductor wiring 3 to be sandwiched therebetween, and then by the adhesive layers 2 by a thermal fusion bonding.

Figure 4:
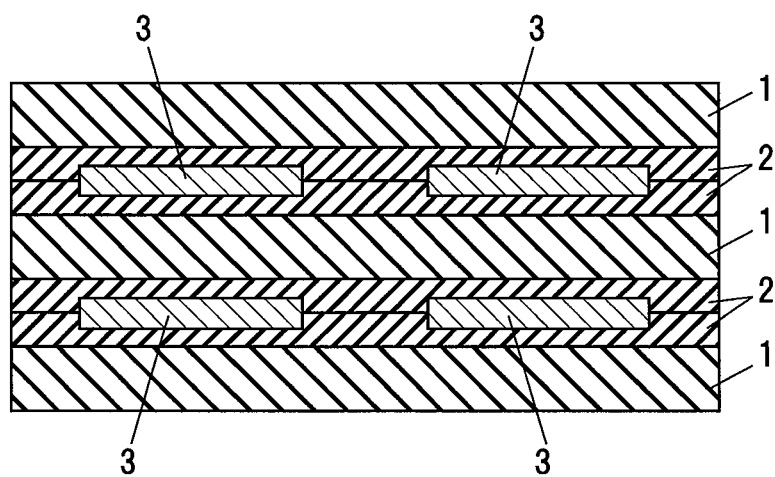
FIG. 4 is a cross-sectional view showing a wiring film according to the second embodiment of the present invention.

Further, as shown in FIG. 4, the wiring film according to the second embodiment of the present invention is fabricated by placing single-sided adhesive films of the above adhesive films, which has the adhesive layer 2 on one surface of the polyimide base material 1, on both surfaces of a double-sided adhesive film, which has the adhesive layers on both surfaces, so that the respective adhesive layers 2 face with each other, by arranging conductor wirings 3 so as to be sandwiched between the two single-sided adhesive films and one double-sided adhesive film, respectively, and then by bonding the adhesive layers 2 by a thermal fusion bonding.

In the wiring film according to the embodiment of the present invention, the thickness of the conductor wiring 3 is preferably in a range of 35 to 500 µm, in order to secure handling ability of the conductor wiring 3 when the conductor wiring 3 is formed on the adhesive film.

In the wiring film according to the embodiment of the present invention, the conductor wiring can comprise plurality of conductor wirings arranged on the same surface.

In the wiring film according to the embodiment of the present invention, when the adhesive layer 2 is bonded by a thermal fusion bonding, a fusion bonding temperature is preferably 160° C. or less, a fusion bonding pressure is 3 MPa or less, more preferably 1 MPa or less, in view of productivity and the like.

To enhance adhesion force between the conductor wiring 3 and the adhesive film, the adhesive layer 2 of the adhesive film is preferably post-heated at a temperature higher than the fusion bonding temperature. Post-heating is preferably done at a post-heating temperature of 180 to 220° C. for 30 to 60 minutes. Post-heating can be done with or without giving a pressure to the wiring film.

In the wiring film according to the embodiment of the present invention, the conductor wiring 3 is preferably a copper wiring in view of high conductivity.

Further, in the wiring film according to the embodiment of the present invention, the at least a part of an external layer of the copper wiring is covered by at least one layer selected from the group consisting of a metal layer, a metal oxide layer and a metal hydroxide layer, which includes at least one element selected from the group consisting of tin, nickel, zinc and cobalt. Due to this, oxidization of the copper wiring is restrained and adhesion property is improved.

Moreover, in the wiring film according to the embodiment of the present invention, the at least a part of an external layer of the conductor wiring 3 is covered by a silane coupling agent including at least one functional group selected from the group consisting of an amino group, a vinyl group, a styryl group, an acrylate group and a methacrylate group. Due to this, adhesion reliability between the conductor wiring 3 and the adhesive layer 2 can be improved.

Since the above silane coupling agents form a single bond with a vinyl group, an acrylate group, or a methacrylate group constituting the component (B) or a maleimide compound constituting the component (C), which are introduced to the phenoxy resin comprising the component (A), the above silane coupling agents have a function of contributing to improving adhesion property, heat resistance, moisture-proof reliability of the wiring film.

The silane coupling agent may comprise e.g. commercially available silane coupling agents such as 3-aminopropyl trimethoxysilane, 3-aminopropyl triethoxysilane, N-2-(aminoethyl)-3-aminopropyl triethoxysilane, N-2-(aminoethyl)-3-aminopropyl trimethoxysilane, vinyl trimethoxysilane, vinyl triethoxysilane, 3-methacryloxypropylmethyldimethoxysilane, 3-methacryloxypropyl trimethoxysilane, 3-acryloxypropyl trimethoxysilane, p-styryl trimethoxysilane.

Surface treatment using the silane coupling agent is preferably done by applying 0.5 to 8 parts by mass aqueous solution of the silane coupling agent to the conductor wiring 3, which is then dehydrated at 100 to 150° C. for 10 to 30 minutes.

EXAMPLES

An adhesive composition, an adhesive varnish, an adhesive film and a wiring film according to the present invention will be more specifically described below using examples. The present invention is not subject to any limitation due to the examples below.

Example 1

(1) Preparing an Adhesive Varnish

An adhesive varnish was prepared by blending each component at a blending ratio as follows:

bisphenol A type phenoxy resin (manufactured by Nippon Steel & Sumikin Chemical Co., Ltd. under trade name of YP50 the mass average molecular weight in terms of styrene: 73000) as a phenoxy resin constituting the component (A): 100 parts by mass;

2-methacryloyloxyethyl isocyanate (manufactured by Showa Denko K.K. under trade name of Karenz (Registered Trademark) MOI) as a multifunctional isocyanate compound constituting the component (B): 10 parts by mass;

bismaleimide (manufactured by Daiwakasei Industry Co., Ltd. under trade name of BMI-5100) as a maleimide compound constituting the component (C): 20 parts by mass;

talc (hydrous magnesium silicate) (manufactured by Nippon Talc Co., Ltd. under trade name of NANO ACE, the average particle size: 1 µm) as an inorganic filler constituting the component (D): 5 parts by mass;

dibutyltin dilaurate (manufactured by Wako Pure Chemical Industries Co., Ltd. under trade name of DBTDL) as an urethane-forming catalyst constituting the component (E): 0.006 parts by mass (1% by mass with respect to a solution blended with an MEK solvent); and dibutyl hydroxytoluene (manufactured by Wako Pure Chemical Industries Co., Ltd. under trade name of BHT) as a radical polymerization inhibitor constituting the component (F): 0.003 parts by mass (1% by mass with respect to a solution blended with an MEK solvent);
and then, by churning in methyl ethyl ketone (MEK) at 40° C. for 24 hours.

(2) Fabricating an Adhesive Film

An adhesive film was fabricated by applying the resultant adhesive varnish on a polyimide base material with an applicator having a predetermined gap, and by dehydrating the adhesive varnish on the base material at 80° C. for 10 minutes, and then at 100° C. for 5 minutes. The thickness of the adhesive film formed on the polyimide base material was controlled to be 25 μm. For the polyimide base material, a polyimide film (a product manufactured by Du Pont-Toray Co., Ltd. under a trade name of Kapton (Registered Trademark) 100V) was used, Examples 2 to 16

In Examples 2 to 16, an adhesive film was made in a similar method as in Example 1, except that a blending ratio of the adhesive varnish was altered from Example 1 to those in Table 1

TABLE 1

| | | | | | Composition in Examples 1 to 16 | | | | | |
|---|---|---|---|---|---|---|---|---|---|---|
| | | Items | | | 1 | 2 | 3 | 4 | 5 | 6 |
| Blend (Parts by mass) | Phenoxy resin | YP-50 Nippon Steel Chemical | bis phenol A type | Mw: 73,000 | 100 | 100 | 100 | 100 | 100 | 100 |
| | Multifunctional isocyanate | Karenz MOI Showa Denko | 2-methacryl-oyloxyethyl isocyanate | — | 10 | 5 | 20 | 40 | 20 | 20 |
| | Urethane-forming catalyst | DBTDL Wako Pure Chemical | dibutyltin dilaurate | — | 0.006 | 0.003 | 0.012 | 0.024 | 0.012 | 0.012 |
| | Polymerization inhibitor | BHT Wako Pure Chemical | dibutylhydroxy-toluene | — | 0.003 | 0.002 | 0.006 | 0.012 | 0.006 | 0.006 |
| | Crosslinking agent | BMI-5100 Daiwakasei Industry | bismaleide | — | 20 | 20 | 20 | 20 | | |
| | | BMI-1000 Daiwakasei Industry | bismaleide | — | | | | | 20 | |
| | | BMI-2300 Daiwakasei Industry | bismaleida | — | | | | | | 20 |
| | | NANO ACE D-1000 Nippon Talc | magnesium silicate | average particle size 1 μm | 5 | 5 | 5 | 5 | 5 | 5 |
| | | AEROSIL R972 EVONIK | silica | average particle size 16 nm | | | | | | |
| | | ST-100 Shiraishi Calcium Kaisha | aluminum silicate | average particle size 4 μm | | | | | | |
| | | LIGHTON BS-0 Bihoku Funka Kogyo | calcium carbonate | average particle size 1 μm | | | | | | |
| | | NIPGEL AY-200 Tosoh Silica Corporation | silica | average partcie size 2 μm | | | | | | |
| | | KISMA5L Kyowa Chemical Industry | magnesium hydroxide | average particle size 1 μm | | | | | | |
| | Solvent | MEK | methyl ethyl ketone | Boinling point about 80° C. | 400 | 400 | 400 | 400 | 400 | 400 |
| Characteristics Evaluation | | Tuck | Good Sliding between films | | ○ | ○ | ○ | ○ | ○ | ○ |
| | | Appearance | No grain | | ○ | ○ | ○ | ○ | ○ | ○ |
| | | Soldering heat resistance | No swelling | | ○ | ○ | ○ | ○ | ○ | ○ |
| | | Moisture-proof reliability | 0.7 N/mm or more | | ○1.2 | ○0.8 | ○1.4 | ○1.1 | ○1.2 | ○1.3 |

| | | | | | Composition in Examples 1 to 16 | | | | |
|---|---|---|---|---|---|---|---|---|---|
| | | Items | | | 7 | 8 | 9 | 10 | 11 |
| Blend (Parts by mass) | Phenoxy resin | YP-50 Nippon Steel Chemical | bis phenol A type | Mw: 73,000 | 100 | 100 | 100 | 100 | 100 |
| | Multifunctional isocyanate | Karenz MOI Showa Denko | 2-methacryl-oyloxyethyl isocyanate | — | 2 | 55 | 2 | 20 | 20 |
| | Urethane-forming catalyst | DBTDL Wako Pure Chemical | dibutyltin dilaurate | — | 0.0012 | 0.033 | 0.0012 | 0.012 | 0.012 |
| | Polymerization inhibitor | BHT Wako Pure Chemical | dibutylhydroxy-toluene | — | 0.0006 | 0.017 | 0.0006 | 0.006 | 0.006 |
| | Crosslinking agent | BMI-5100 Daiwakasei Industry | bismaleide | — | | | | | |
| | | BMI-1000 Daiwakasei Industry | bismaleide | — | | | | | |

TABLE 1-continued

|  |  |  |  | | | | | |
|---|---|---|---|---|---|---|---|---|
|  |  | BMI-2300<br>Daiwakasei Industry | bismaleida | — | 5 | 5 | 30 | 20 | 20 |
|  |  | NANO ACE D-1000<br>Nippon Talc | magnesium silicate | average particle size 1 μm | 5 | 5 | 5 | 1 | 50 |
|  |  | AEROSIL R972<br>EVONIK | silica | average particle size 16 nm | | | | | |
|  |  | ST-100<br>Shiraishi Calcium Kaisha | aluminum silicate | average particle size 4 μm | | | | | |
|  |  | LIGHTON BS-0<br>Bihoku Funka Kogyo | calcium carbonate | average particle size 1 μm | | | | | |
|  |  | NIPGEL AY-200<br>Tosoh Silica Corporation | silica | average partcie size 2 μm | | | | | |
|  |  | KISMA5L<br>Kyowa Chemical Industry | magnesium hydroxide | average particle size 1 μm | | | | | |
|  | Solvent | MEK | methyl ethyl ketone | Boinling point about 80° C. | 400 | 400 | 400 | 400 | 400 |
| Characteristics<br>Evaluation | Tuck | | Good Sliding between films | | ○ | ○ | ○ | ○ | ○ |
|  | Appearance | | No grain | | ○ | ○ | ○ | ○ | ○ |
|  | Soldering heat resistance | | No swelling | | ○ | ○ | ○ | ○ | ○ |
|  | Moisture-proof reliability | | 0.7 N/mm or more | | ○0.7 | ○1.0 | 0.7 | ○1.4 | ○0.7 |

|  |  |  |  |  | Composition in Examples 1 to 16 | | | | |
|---|---|---|---|---|---|---|---|---|---|
|  |  | Items | | | 12 | 13 | 14 | 15 | 16 |
| Blend<br>(Parts by mass) | Phenoxy resin | YP-50<br>Nippon Steel Chemical | bis phenol A type | Mw: 73,000 | 100 | 100 | 100 | 100 | 100 |
|  | Multifunctional isocyanate | Karenz MOI<br>Showa Denko | 2-methacryl-oyloxyethyl isocyanate | — | 20 | 20 | 20 | 20 | 20 |
|  | Urethane-forming catalyst | DBTDL<br>Wako Pure Chemical | dibutyltin dilaurate | — | 0.012 | 0.012 | 0.012 | 0.012 | 0.012 |
|  | Polymerization inhibitor | BHT<br>Wako Pure Chemical | dibutylhydroxy-toluene | — | 0.006 | 0.006 | 0.006 | 0.006 | 0.006 |
|  | Crosslinking agent | BMI-5100<br>Daiwakasei Industry | bismaleide | — | | | | | |
|  |  | BMI-1000<br>Daiwakasei Industry | bismaleide | — | | | | | |
|  |  | BMI-2300<br>Daiwakasei Industry | bismaleida | — | 20 | 20 | 20 | 20 | 20 |
|  |  | NANO ACE D-1000<br>Nippon Talc | magnesium silicate | average particle size 1 μm | | | | | |
|  |  | AEROSIL R972<br>EVONIK | silica | average particle size 16 nm | 1 | | | | |
|  |  | ST-100<br>Shiraishi Calcium Kaisha | aluminum silicate | average particle size 4 μm | | 2 | | | |
|  |  | LIGHTON BS-0<br>Bihoku Funka Kogyo | calcium carbonate | average particle size 1 μm | | | 5 | | |
|  |  | NIPGEL AY-200<br>Tosoh Silica Corporation | silica | average partcie size 2 μm | | | | 10 | |
|  |  | KISMA5L<br>Kyowa Chemical Industry | magnesium hydroxide | average particle size 1 μm | | | | | 20 |
|  | Solvent | MEK | methyl ethyl ketone | Boinling point about 80° C. | 400 | 400 | 400 | 400 | 400 |
| Characteristics<br>Evaluation | Tuck | | Good Sliding between films | | ○ | ○ | ○ | ○ | ○ |
|  | Appearance | | No grain | | ○ | ○ | ○ | ○ | ○ |
|  | Soldering heat resistance | | No swelling | | ○ | ○ | ○ | ○ | ○ |
|  | Moisture-proof reliability | | 0.7 N/mm or more | | ○1.3 | ○1.2 | ○1.3 | ○1.0 | ○1.0 |

Comparative Examples 1 to 7

In Comparative Examples 1 to 7, an adhesive film was made in a similar method as in Example 1, except that a blending ratio of the adhesive varnish was altered from Example 1 to those in Table 2.

between the conductor and the adhesive film. When a peel strength (N/mm) was 0.7 N/mm or more, the result was given as "○" (Pass); when the value was 0.6 N/mm or more and less than 0.7 N/mm, the result was given as "Δ" (Fail); and when the value was less than 0.6 N/mm, the result was given as "x" (Fail).

TABLE 2

| | Items | | | | Composition in Comparative Examples 1 to 7 | | | | | | |
|---|---|---|---|---|---|---|---|---|---|---|---|
| | | | | | 1 | 2 | 3 | 4 | 5 | 6 | 7 |
| Blend (Parts by mass) | Phenoxy resin | YP-50 | bisphenol A type | Mw: 73,000 | 100 | 100 | 100 | 100 | 100 | 100 | 100 |
| | Multifunctional isocyanate | Karenz MOI Showa Denko | 2-methacryl-oyloxyethyl isocyanate | — | | 1 | 2 | 10 | 10 | 70 | 20 |
| | Urethane-forming catalyst | DBTDL Wako Pure Chemical | dibutyltin dilaurate | — | | 0.001 | 0.001 | 0.006 | 0.006 | 0.042 | 0.006 |
| | Polymerization Inhibitor | BHT Wako Pure Chemical | dibutylhydroxy toluene | — | | 0.001 | 0.001 | 0.003 | 0.003 | 0.021 | 0.003 |
| | Crosslinking agent | BMI-5100 Daiwakasei industry | bismaleide | — | 10 | 5 | 4 | 15 | 15 | 20 | 40 |
| | Filler | LIGHTON BS-0 Bihoku Funka Kogyo | calcium carbonate | average particle size 1 μm | | | | | | 50 | 5 |
| | | BF300 Bihoku Funka Kogyo | calcium carbonate | average particle size 8 μm | | | | | 2 | | |
| | Solvent | MEK | methyl ethyl ketone | Boinling point about 80° C. | 400 | 400 | 400 | 400 | 400 | 400 | 400 |
| Characteristics Evaluation | Tuck | | Good Sliding between films | | X | X | X | X | ○ | X | ○ |
| | Appearance | | No grain | | ○ | ○ | ○ | ○ | X | ○ | ○ |
| | Soldering heat resistance | | No swelling | | X | X | X | ○ | ○ | ○ | ○ |
| | Initial adhesion force | | 0.7 N/mm or more | | X0.1 | X0.5 | X0.5 | ○1.1 | ○0.7 | ○0.7 | X0.5 |

(Evaluation Test)

Following evaluation tests were given to a resultant adhesive film. Evaluation results are shown in Tables 1 and 2.

(1) Tuck

An adhesive film was fixed on a flat and smooth board so that an adhesive layer side thereof came to the surface. Another adhesive film was overlapped on this so that the adhesive layer sides came to face with each other and the overlapped adhesive film was made to slide using a hand. When the film slid without being caught, the result was given as "○" (Pass); when the film got caught and does not slide smoothly, the result was given as"x" (Fail).

(2) Appearance

When a grain was not observed on the adhesive layer of the adhesive film by a visual inspection, the result was given as "○" (Pass); when a grain was observed, the result was given as "x" (Fail).

(3) Initial Adhesion Force

A conductor was prepared as follows. That is, a Ni-plated layer having a thickness of 0.5 μm was formed on an oxygen-free copper foil having a thickness of 300 μm. A conductor was obtained after a Ni-plated conductor thus formed was washed by UV ozone treatment, dipped in 1% aqueous solution of 3-methacryloxypropyl trimethoxysilane for 3 minutes before taken out, dehydrated at 110° C. for 10 minutes and treated with silane. The resultant conductor was placed on an adhesive layer side of the adhesive film and then glued by being heated for 10 minutes under a condition of 160° C. and 1 MPa. Then, a sample film was obtained by heating the conductor in the atmosphere without adding pressure at 180° C. for 60 minutes. As to a sample formed by cutting out the sample film by 1 cm in width, a 180° peel test was conducted (4) Moisture-Proof Reliability, The sample to be evaluated in terms of initial adhesion force was let to stand still in a constant humidity and temperature environment with humidity of 85% and temperature of 85° C. for 1000 hours. After that, 180° peel test was conducted. When a peel strength (N/mm) was 0.7 N/mm or more, the result was given "○" (Pass); when the value was 0.6 N/mm or more and less than 0.7 N/mm, the result was given as "Δ" (Fail); and when the value was less than 0.6 N/mm, the result was given as"x" (Fail).

(5) Soldering Heat Resistance

The above conductor was placed on the adhesive layer side of the adhesive film and then bonded by adding pressure for 10 minutes under a condition of 160° C. and 1 MPa. Then, a sample film was obtained by heating the conductor in the atmosphere without adding pressure at 180° C. for 60 minutes. The sample was let to float in a molten solder bath of 280° C. for 1 hour. The result for the sample with no swelling was given as "○" (Pass); the result for the sample with a swelling was given as "x" (Fail).

(Evaluation Result)

The following was what was observed from Tables 1 and 2.

Example 1 is an example in which the inorganic filler (hydrous magnesium silicate, commonly known by talc) was used in an amount of 5 parts by mass. An adhesive film without tuck and with good appearance was obtained. A wiring film using this film has a good result both in soldering heat resistance, moisture-proof reliability.

Examples 2 to 4 are examples in which the blending amount of the multifunctional isocyanate was altered. Regardless of the blending amount, an adhesive film without a tuck and with good appearance was obtained. A wiring film using this has a good result both in soldering heat resistance, moisture-proof reliability.

Examples 5 and 6 are examples in which the type of the maleimide compound was altered. Regardless of the type of the maleimide compound, an adhesive film without a tuck and with good appearance was obtained. A wiring film using this has a good result both in soldering heat resistance, moisture-proof reliability.

Examples 7 and 8 are examples in which the amount of the maleimide compound was 5 parts by mass and the blending amount of the multifunctional isocyanate was altered. In either case, an adhesive film without a tuck and with good appearance was obtained. A wiring film using this has a good result both in soldering heat resistance, moisture-proof reliability.

Example 9 is an example in which the amount of the maleimide compound was 30 parts by mass and the blending amount of the multifunctional isocyanate was 2 parts by mass. An adhesive film without a tuck and with good appearance was obtained. A wiring film using this has a good result both in soldering heat resistance, moisture-proof reliability.

Example 10 is an example in which the amount of the inorganic filler was 1 part by mass. It was observed that even the amount of 1 part by mass can restrain a tuck.

Example 11 is an example in which the additive amount of the inorganic filler was 50 parts by mass. It was observed that even the amount of 50 parts by mass can preserve sufficient adhesion force even after moisture-proof reliability test.

Examples 12 to 16 are examples in which the various inorganic fillers were added in the range of 1 to 50 parts by mass. Regardless of the type of the filler or its amount, an adhesive film without a tuck and with good appearance was obtained. A wiring film using this has a good result both in soldering heat resistance, moisture-proof reliability.

Comparative Example 1 is an example in which the multifunctional isocyanate compound was not contained. The result was not satisfactory in initial adhesion force and in soldering heat resistance.

Comparative Example 2 is an example in which the blending amount of the multifunctional isocyanate compound was not sufficient (which was also an example in which the total amount of the multifunctional isocyanate compound constituting the component (B) and the maleimide component constituting the component (C) was not sufficient). The result was not satisfactory in initial adhesion force and in soldering heat resistance.

Comparative Example 3 is an example in which the blending amount of the maleimide compound as the crosslinking agent was not sufficient (which is also an example in which the total amount of the multifunctional isocyanate compound and the maleimide component was not sufficient). The result was not satisfactory in initial adhesion force and in soldering heat resistance.

Comparative Example 4 is an example in which the inorganic filler was not contained. The result was satisfactory in initial adhesion force and in soldering heat resistance, but a tuck was found.

Comparative Example 5 is an example in which the inorganic filler with an average particle size larger than necessary was not contained. Since the grain was large enough for visual inspection, the result of the appearance test was a failure.

Comparative Example 6 is an example in which excessive amount of the multifunctional isocyanate compound was contained (which is also an example in which the total amount of the multifunctional isocyanate compound and the maleimide component was excessive). Accordingly, a tuck was not restrained even though the inorganic filler was added.

Comparative Example 7 is an example in which excessive amount of the bismaleimide was contained. Accordingly, crosslinking occurred excessively and initial adhesion force was not satisfactory.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A double-sided adhesive film comprising:
   a polyimide base material; and
   adhesive layers comprising an adhesive composition and provided on both surfaces of the polyimide base material,
   wherein the adhesive composition includes
   (A) a phenoxy resin including a plurality of hydroxyl groups at a side chain: 100 parts by mass;
   (B) a multifunctional isocyanate compound comprising an isocyanate and at least one functional group selected from the group consisting of a vinyl group, an acrylate group and a methacrylate group within its molecule: 2 to 55 parts by mass;
   (C) a maleimide compound and/or a reaction product thereof having a plurality of maleimide groups within its molecule: 5 to 30 parts by mass; and
   (D) one or more kinds of an inorganic filler having an average particle size of 5 μm or less which is measured by a laser diffraction: 1 to 50 parts by mass, and
   wherein a total amount of the components (B) and (C) is 7 to 60 parts by mass.

2. The adhesive film according to claim 1, wherein the adhesive layers have a thickness of 10 to 100 μm and the polyimide base material has a thickness of 25 to 100 μm.

3. A wiring film comprising:
   a double-sided adhesive film comprising a polyimide base material and adhesive layers comprising an adhesive composition on both surfaces;
   single-sided adhesive films, each of which comprises a polyimide base material and an adhesive layer comprising the adhesive composition on a surface of the polyimide base material, the single-sided adhesive films being located such that the adhesive layers of the single-sided adhesive films face to the adhesive layers of the double-sided adhesive film, respectively;
   conductor wirings sandwiched between the adhesive layers of the double-sided adhesive film and the adhesive layers of the single-sided adhesive films, respectively,
   wherein the adhesive layers are bonded by a thermal fusion bonding,
   wherein the adhesive composition includes
   (A) a phenoxy resin including a plurality of hydroxyl groups at a side chain: 100 parts by mass;
   (B) a multifunctional isocyanate compound comprising an isocyanate and at least one functional group selected from the group consisting of a vinyl group, an acrylate group and a methacrylate group within its molecule: 2 to 55 parts by mass;
   (C) a maleimide compound and/or a reaction product thereof having a plurality of maleimide groups within its molecule: 5 to 30 parts by mass; and
   (D) one or more kinds of an inorganic filler having an average particle size of 5 μm or less which is measured by a laser diffraction: 1 to 50 parts by mass, and
   wherein a total amount of the components (B) and (C) is 7 to 60 parts by mass.

4. The wiring film according to claim 3, wherein each of the conductor wirings has a thickness of 35 to 500 μm.

5. The wiring film according to claim 3, wherein the wiring film is post-heated at a temperature higher a fusion bonding temperature of the adhesive layer.

6. The wiring film according to claim 3, wherein each of the conductor wirings comprises a copper wiring.

7. The wiring film according to claim 6, wherein at least a part of an external layer of each of the copper wirings is covered by at least one layer selected from the group consisting of a metal layer, a metal oxide layer and a metal hydroxide layer, which includes at least one element selected from the group consisting of tin, nickel, zinc and cobalt.

8. The wiring film according to claim 3, wherein at least a part of an external layer of the conductor wiring is covered by a silane coupling agent including at least one functional group selected from the group consisting of an amino group, a vinyl group, a styryl group, an acrylate group and a methacrylate group.

* * * * *